(12) United States Patent
Nguyen et al.

(10) Patent No.: US 6,211,716 B1
(45) Date of Patent: Apr. 3, 2001

(54) BASELINE WANDER COMPENSATION CIRCUIT AND METHOD

(75) Inventors: Hai T. Nguyen, San Jose; Menping Chang, Cupertino, both of CA (US)

(73) Assignee: Kendin Communications, Inc., Sunnyvale, CA (US)

( * ) Notice: Subject to any disclaimer, the term of this patent is extended or adjusted under 35 U.S.C. 154(b) by 0 days.

(21) Appl. No.: 09/322,247

(22) Filed: May 28, 1999

(51) Int. Cl.[7] .................................................. H03L 5/00
(52) U.S. Cl. ............................................. 327/307; 327/62
(58) Field of Search ................................. 327/307, 362, 327/363, 65, 67, 69, 72, 73

(56) References Cited

U.S. PATENT DOCUMENTS

| | | | |
|---|---|---|---|
| 4,575,683 | * | 3/1986 | Roberts et al. ........................ 327/78 |
| 5,267,269 | | 11/1993 | Shih et al. ............................. 375/60 |
| 5,428,307 | * | 6/1995 | Dendinger .............................. 327/62 |
| 5,539,779 | * | 7/1996 | Nagahori .............................. 327/307 |
| 5,546,027 | * | 8/1996 | Shinozaki et al. ..................... 327/59 |
| 6,018,407 | * | 1/2000 | Hatakeyama et al. ............... 327/309 |
| 6,041,084 | * | 3/2000 | Nagaraj ................................. 327/77 |

OTHER PUBLICATIONS

Johnson, Mark G, et al. "A Variable Delay Line PLL for CPU—Coprocessor Synchronization" Oct. 1988, pp. 1218–1223, *IEEE Journal of Solid–State Circuits*, vol. 23 No. 5.

Sonntag, Jeff, et al. "A Monolithic CMOS 10 MHz DPLL for Burst–Mode Data Retiming", Feb. 16, 1990, pp. 194–195 and 294, 1990 IEEE International Solid–State Circuits Conference Digest of Technical Papers, 37th ISSCC, First Edition.

Everitt, James, et al., "A CMOS Transceiver for 10–Mb/s and 100–Mb/s Ethernet", Dec. 1998, pp. 2169–2177, *IEEE Journal of Solid–State Circuits*, vol. 33, No. 12.

* cited by examiner

*Primary Examiner*—Toan Tran
(74) *Attorney, Agent, or Firm*—Fenwick & West, LLP

(57) ABSTRACT

An apparatus of compensating for offset in a received signal generated from a forward path stage, includes a first peak detector for receiving a first signal from the forward path stage and capable of detecting a peak of the first signal; a second peak detector for receiving a second signal from the forward path stage and capable of detecting a peak of the second signal; a differential amplifier coupled to the first peak detector and the second peak detector and capable of generating an offset control signal; and a compensation stage coupled to the differential amplifier and capable of compensating for offset in the received signal in response to the offset control signal. A method of compensating for offset in a received signal includes detecting a level of a first signal from a forward path stage; detecting a level of a second signal from the forward path stage; and generating an offset control signal to reduce an offset in the received signal in response to the level difference of the first signal and the second signal.

10 Claims, 14 Drawing Sheets

Conventional Offset Cancellation Circuit

Timing Window Generator

Data Signals and its Peaks Before Offset Compensation

Data Signals and its Peaks After Offset Compensation

BASELINE WANDER COMPENSATION CIRCUIT AND METHOD

CROSS-REFERENCE TO RELATED APPLICATION

The subject matter of this application is related to the subject matter of the following co-pending U.S. Applications: (1) U.S. application Ser. No. 09/322,668, filed May 28, 1999 by Jung-Chen Lin, entitled "A DELAY LOCKED LOOP FOR SUB-MICRON SINGLE-POLY DIGITAL CMOS PROCESSES" which is fully incorporated herein by reference; (2) U.S. application Ser. No. 09/321,983, filed May 28, 1999 by Menping Chang and Vuong Kim Le, entitled "UNIVERSAL OUTPUT DRIVER AND FILTER" which is fully incorporated herein by reference; (3) U.S. application Ser. No. 09/321,403, filed May 28, 1999 by Menping Chang and Hai T. Nguyen, entitled "ADAPTIVE EQUALIZER AND METHOD" which is fully incorporated herein by reference; (4) U.S. application Ser. No. 09/321,935, filed May 28, 1999 by Menping Chang and Hai T. Nguyen, entitled "SELECTIVE SAMPLED PEAK DETECTOR AND METHOD" which is fully incorporated herein by reference.

FIELD OF THE INVENTION

The present invention relates generally to the field of data communication and more particularly to a circuit and method for compensating for baseline wander occurrences in data signals.

BACKGROUND OF THE INVENTION

In 100 Base TX applications of a Copper Distributed Data Interface (CDDI), a data signal is transmitted across a twisted-pair copper wire that is commonly known as CAT-5 cable. The data signal is then AC coupled through a primary side of a transformer and received by a receiver connected to the secondary side of the transformer. This method of AC coupling the data signals through the transformer may cause the average DC value of the signal to drift (i.e., wander) significantly over time, as shown in FIG. 1a. The data signal 100 is a waveform of an ideal MLT-3 signal, while the data signal 105 is a waveform of an MLT-3 signal that has been affected by Baseline Wander.

Baseline Wander occurs due to the high pass characteristics of the transformer. The transformer will suppress the DC level if data signal remains in the same level for a long time. This can cause the data signals to "droop" over time, as illustrated in FIG. 1a. This drooping behavior may accumulate over time and may cause a maximum offset of 750 mV, differentially.

In the process of receiving and recovering data, uncompensated Baseline Wander offset can cause serious signal distortions due to the limited linear range of the amplifiers along the data path and can cause high jitter. This makes data slicing difficult and results in received errors. Therefore, Baseline Wander correction is important in the recovery of transmitted data signals.

An overview of a typical offset cancellation circuit is now discussed to provide better understanding of conventional approaches. FIG. 1b is a schematic block diagram of an offset cancellation circuit 120, which includes a forward path block 121 with a gain of $A_1$, feedback path block 122 with a feedback gain of $A_2$, and a summing point 125. Equation (1) expresses the differential output voltage Vo of circuit 120 and explains the offset cancellation function.

$$[(V_{IN}+\Delta v)-(A_2)(Vo)]A_1=Vo \quad (1)$$

The term $V_{IN}$ is the input signal in circuit 120 while $\Delta v$ is the offset voltage added to the input signal $V_{IN}$. The equations (2) and (3) can then be subsequently derived from equation (1).

$$A_1(V_{IN}+\Delta v)=[1+(A_1)(A_2)]Vo \quad (2)$$

$$Vo=(V_{IN}+\Delta v)A_1/[1+(A_1)(A_2)] \quad (3)$$

For stability of the feedback system in FIG. 1b, the feedback gain $A_2$ has a low pass characteristic such that it has a high gain (i.e., $A_2 \gg 1$) at low frequency operation and has a very small gain (i.e., $A_2 \ll 1$) at high frequency operation. For a low frequency gain, $A_2 \gg 1$, the term $[1+(A_1 \times A_2)]$ represents the denominator in the equation (3) and, therefore, the denominator also has a large value. As a result, the effect of offset is minimized. However at high frequency, the denominator of equation (3) approaches a unity value and equation (3) can be approximated as equation (4).

$$Vo=(V_{IN}+\Delta v) \times A_1 \quad (4)$$

It is noted that in the case where equation (4) is satisfied, the offset voltage $\Delta v$ can not be canceled. Since the baseline wander effect is not a constant DC effect but an AC phenomenon, it is not cancelable by use of the offset cancellation circuit 120.

A conventional Baseline Wander compensation version of an offset cancellation circuit 120 is shown in the circuit 150 of FIG. 1c. The circuit 150 includes a feed forward path block 121 with a gain of $A_1$, the feedback path block 155 with a gain of $A_2$ and a summing point 125. The feedback path block 155 compares the output signal Vo with a replicated ideal signal 130, which has the same DC bias, DC gain and AC gain as an ideal output signal $Vo_{(ideal)}$ with no Baseline Wander offset. As the Baseline Wander event occurs at the input signal $V_{IN}$ and consequentially at the output signal Vo, the feedback stage 155 detects this offset by comparing the output voltage Vo with the replica 130 and outputs a feedback signal 140 to compensate for Baseline Wander. As a result of this compensation, the offset or baseline wander is minimized at the input of the feed forward path block 121.

However in practice, there is a phase difference between the replica signal 130 and the output signal Vo, as shown in FIG. 1d. Although the effects of a phase difference can be "smoothed" out by using the low pass filter in the feedback path 155, the phase difference still causes some unwanted ripple in the output signal 140. As a result, the data output Vo has excessive jitter (noise) due to the offset ripple into the summing point 125 and then amplified by 121.

Another problem, which is more severe, is the variations and mismatches in either DC gain and AC gain of the output signal Vo and its ideal replica 130 as shown in FIG. 1e. Even though there is no phase shift in this case, the gain mismatch causes a residue signal that translates into offset ripple (Vo-Replica signal 130). Notice that Vo is the output of an analog signal and replica signal 130 is synthesized from a digital data. The two waveforms cannot be match perfectly in terms of overshoot and rise/fall time and it is very difficult for the forward block 121 to have a fix gain over process, temperature and supply voltage. This results in unwanted ripples and potential errors. These ripples are the results of phase delay and gain mismatch and are always present regardless of the effect of baseline wander. Consequently, the performance of this replica approach is very limited.

Therefore, there is a need for a baseline wander compensation approach that overcomes the unwanted ripples and errors in conventional baseline wander compensation systems.

SUMMARY OF THE INVENTION

The apparatus and method of the present invention operates to track and dynamically compensate for the Baseline Wander event. The apparatus includes a first peak detector for receiving a first signal from a forward path stage and capable of detecting a peak of the first signal, and a second peak detector for receiving a second signal from the forward path stage and capable of detecting a peak of the second signal. The apparatus also includes a differential amplifier coupled to the first peak detector and the second peak detector and capable of generating an offset control signal, and a compensation stage coupled to the differential amplifier and capable of compensating for offset in the received signal in response to the offset control signal.

In another aspect of the present invention, the apparatus may also include a pair of selective sample peak detectors that are capable of sampling a portion of the input signal. The sampled portion of the input signal is defined by a "smart window" (timing window) which is received by a sample and block circuit of the peak detector. By making uses of these peak detectors and the smart or timing windows, the present invention is able to detect correctly the peak levels of the positive and negative signals independently and compares these levels for any potential offset caused by a Baseline Wander event. The present invention then outputs a Baseline Wander control signal to compensate for Baseline Wander.

The method of Baseline Wander compensation in accordance with the present invention is able to compensate the offset in data signals independently of its AC and DC gain. Furthermore, the present invention provides a Baseline Wander compensation approach that is fully differential, thereby permitting a circuit in accordance with the present invention to have improved immunity to noise.

DETAILED DESCRIPTION OF THE PREFERRED EMBODIMENTS

Figure 2A:
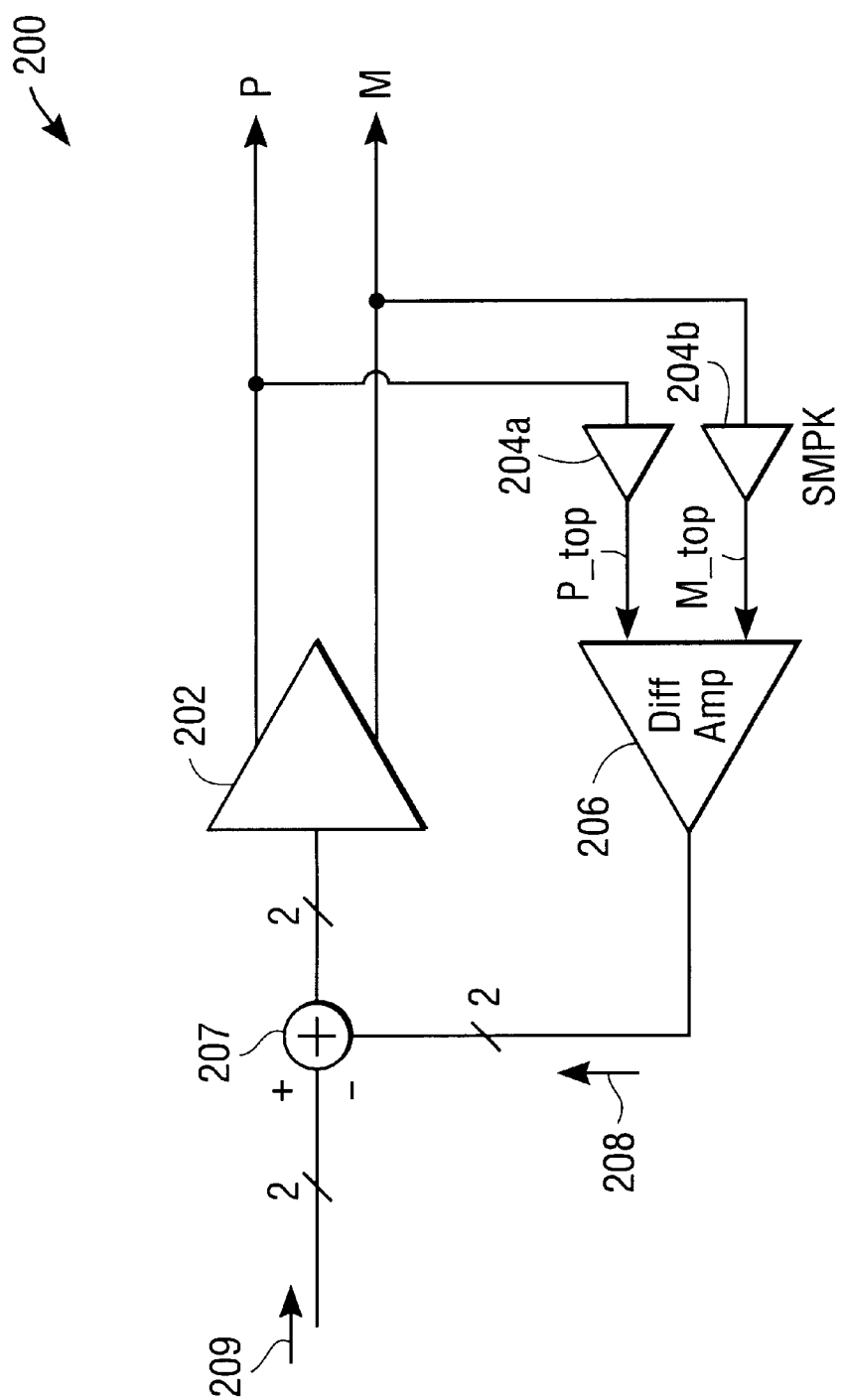
FIG. 2a is a schematic block diagram of an offset or baseline wander compensation circuit in accordance with an embodiment of the present invention.

FIG. 2a is a schematic block diagram of a circuit 200 for performing baseline wander and offset compensation, in accordance with an embodiment of the present invention. The circuit 200 includes a forward path stage 202 for generating differential output signals P and M, peak detectors 204a and 204b for receiving the P signal and M signal, respectively, a differential amplifier 206 for comparing the outputs of peak detectors 204a and 204b, and a summing stage 207 to subtract the differential amplifier outputs from input signals 209. In one embodiment, the circuit 200 applies a sampled peak detection approach to extract the peak levels of the signals P and M, as described in additional details below and in the above-referenced U.S. Application, filed May 28, 1999 Menping Chang and Hai T. Nguyen, and entitled "SELECTIVE SAMPLED PEAK DETECTOR AND METHOD". The peak detector 204a or 204b has a low-pass filter function, but with enough bandwidth to track the Baseline Wander event. By comparing the peak levels of signals P and M, the present invention is able to detect and compensate the Baseline Wander offset dynamically. Therefore, the present invention advantageously does not rely on fixed amplitude signals or replica signal to compensate for Baseline Wander offset as required by the conventional approach.

Figure 2B:
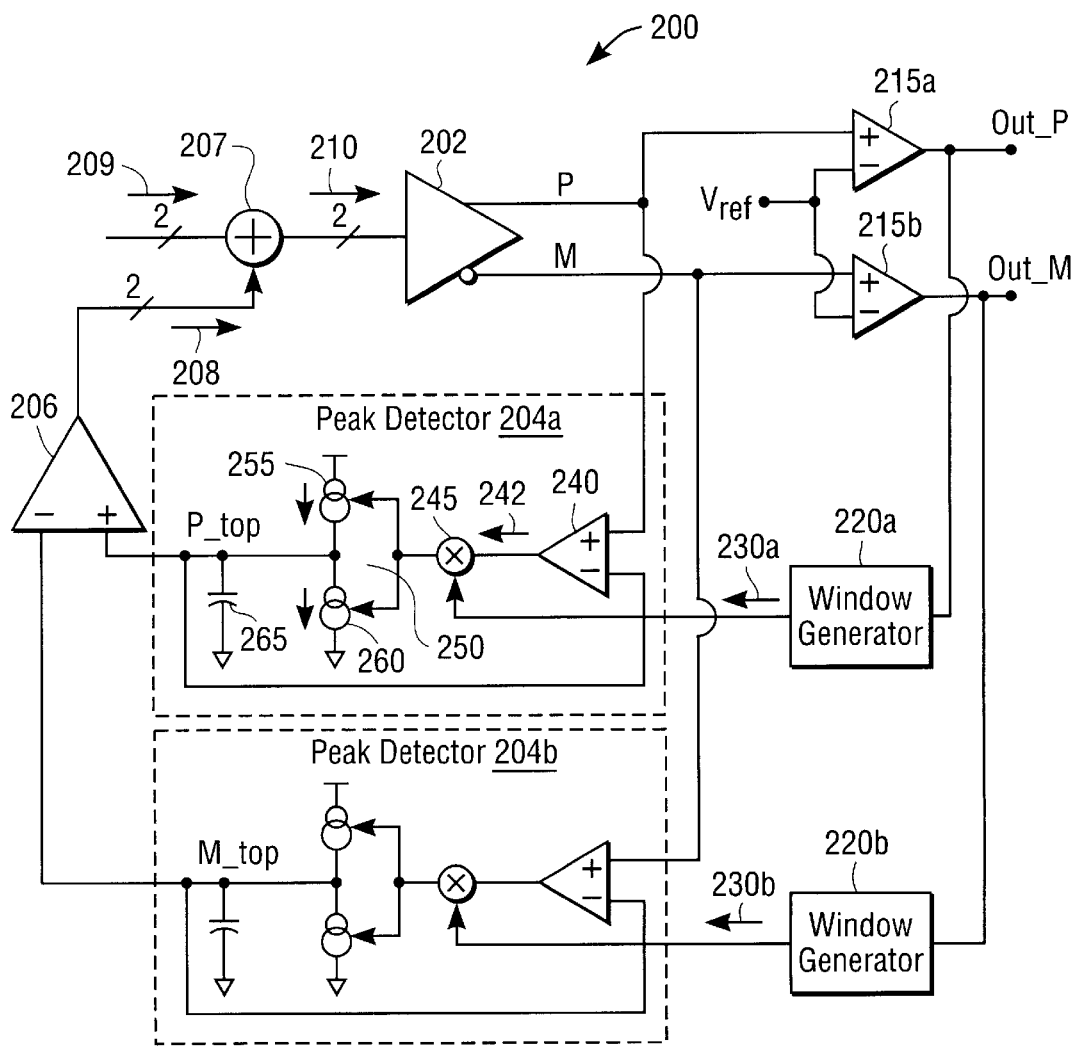
FIG. 2b is a schematic block diagram of the offset or baseline wander compensation circuit of FIG. 2a shown in additional details.

FIG. 2b is a schematic block diagram of the present invention shown in additional details that expand the peak detectors 204a and 204b into several components and introduces the additional circuit blocks, as described below, to correctly extract the peak information of the data signals P and M.

Figure 2C:
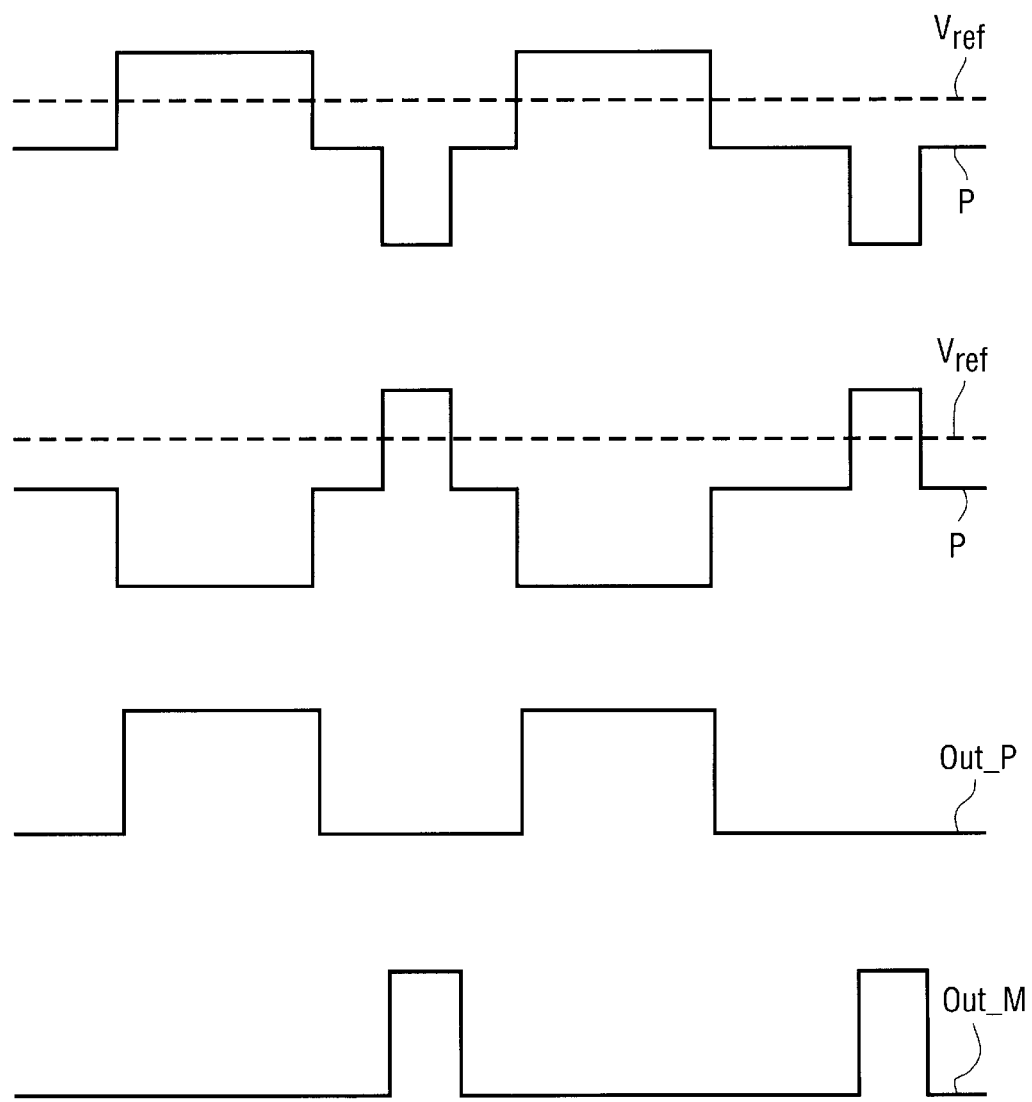
FIG. 2c is a waveform diagram that illustrates the conversion of data signals from MLT-3 into binary as triggers for the window generator.

The comparators 215a and 215b compare the forward path 202 output signals P and M with an internal generated reference voltage Vref to slice out the output signals out_P and out_M, respectively. As shown in FIG. 2C, the MLT-3 data signal P is sliced against a voltage level Vref to generate output signal out_P, while the MLT-3 data signal M is sliced against a voltage level Vref to generate output signal out_M.

The circuit 200 also includes a pair of window generators 220a and 220b and a pair of peak detectors 204a and 204b. Similar window generators and peak detectors are also shown and described in the above-referenced U.S. Patent Application entitled "Selective Sampled Peak Detector" by Hai T. Nguyen and Menping Chang.

Figure 2D:
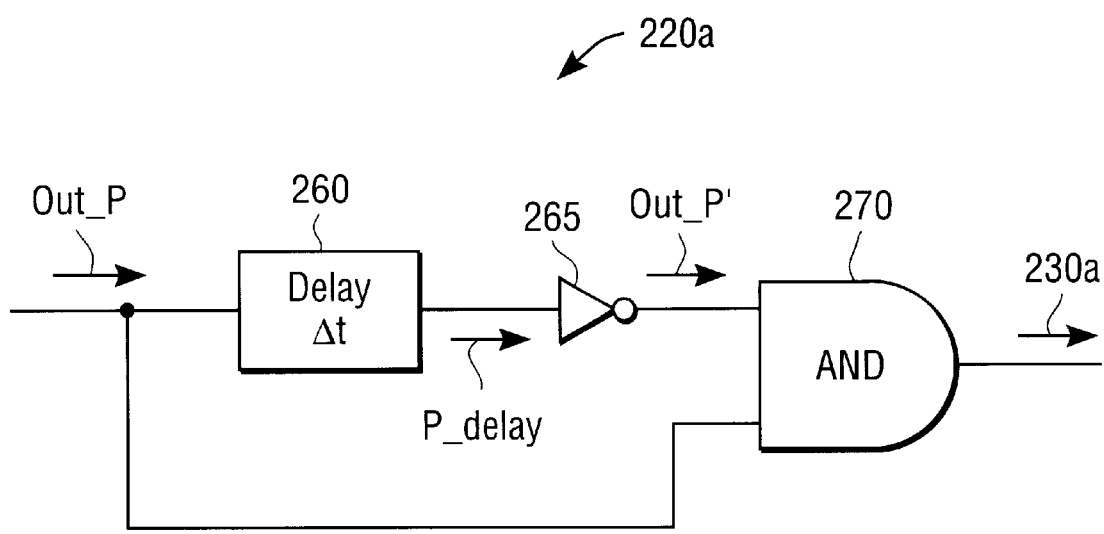
FIG. 2d is a schematic block diagram of one embodiment of a smart window generator.
Figure 2E:
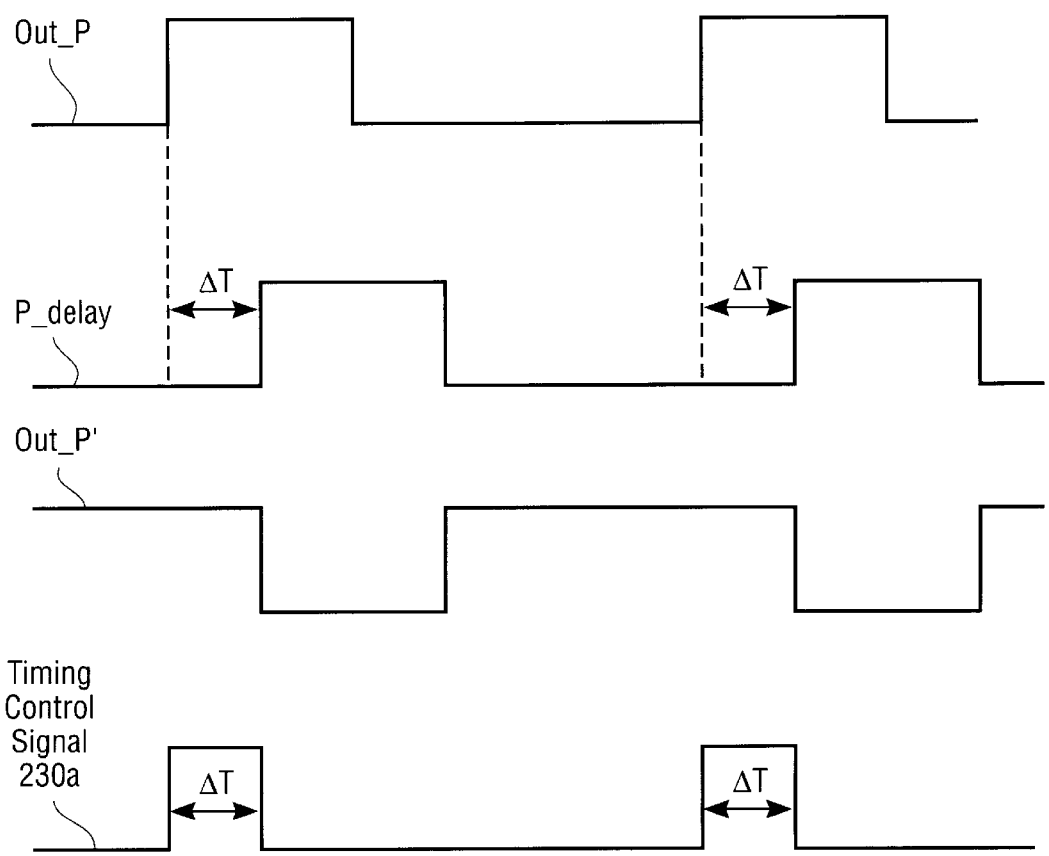
FIG. 2e illustrates the waveforms of the window generator in FIG. 2d.

The pair of window generators 220a and 220b receives the output signals out_P and out_M, respectively, as triggers to generate timing control signals, 230a and 230b. An example of such window generator is shown in the schematic block diagram of FIG. 2d and the waveform for such a window generator is shown in FIG. 2e. The operation of the window generator is described as follows. A signal out_P is delayed by a delay stage 260 by time ΔT and inverted by inverter 265 into an inverted/delayed signal out_P'. The input signal out_P and the inverted/delay signal out_P' are ANDed by AND gate 270 to generate the control signal 230a.

Similarly for input signal out_M, the window generator 220b outputs the control signal 230b. As a result of using a window generator as shown in FIGS. 2d–2e, the timing control signals 230a and 230b are simply pulses with time interval ΔT.

The timing control signals 230a and 230b are then used as a timing windows to selectively "sample" the top peaks of the forward path output signals P and M through the peak detectors 204a and 204b, respectively. The peak detector 204a uses the timing control signal 230a to "sample" the top peak of forward path output signal P to output the average top peak voltage P_top, while the peak detector 204b uses the sample/block control signal 230b to "sample" the top peak of forward path output signal M to output the average top peak voltage M_top.

Figure 3:
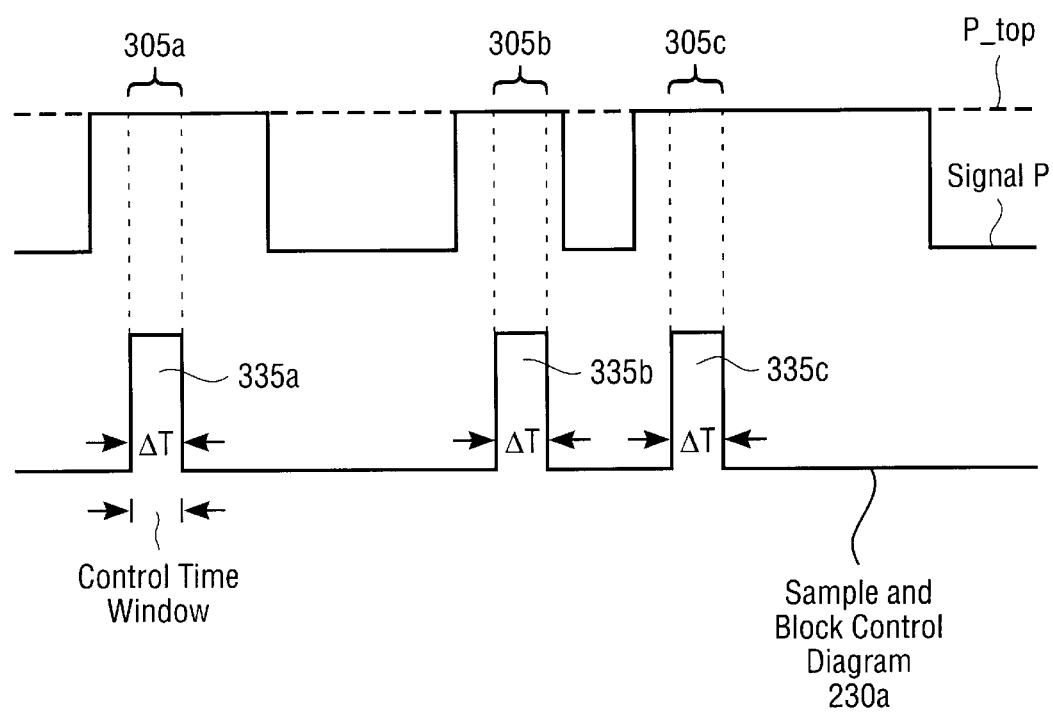
FIG. 3 is a waveform diagram that shows the use of sampling windows to generate the average peak level of a signal.

Reference is now made to FIGS. 2b and 3 to describe the operation of a peak detector in FIG. 2b. In this example, only the operation of the peak detector 204a is described. The peak detector 204a includes a comparator 240 for comparing the positive signal P with the average peak detector output P_top that is generated at the output of peak detector 204a. The comparator 240 generates a comparing value signal 242 based upon the comparison of the detected peak level of P signal (P_top) and the positive P signal. A sample and block circuit 245 receives pulses 335a–335c (FIG. 3) of time interval ΔT from the control signal 230a, as sampling windows, to timely "ΔT" charge the charge pump 250 (FIG. 2b), which may include a pull-up current source 255, a pull-down current source 260, and a output capacitor 265 having a voltage value corresponding to P_top. The charge pump 250 either charges up or charges down the capacitor 265 during ΔT time interval depending on whether the comparing value 242 is high or low, respectively. The charge pump 250 is inactive outside the timing interval ΔT and the output voltage P_top remains the same during that time. As a result of selectively sampling the signal P by the peak detector, the output signal P_top averages out the top peaks 305a–305c of signal P within the pulses 335a–335c.

A differential amplifier 206 (FIG. 2b) then compares the values of the top peaks P_top and M_top for any potential offset caused by a Baseline Wander event and generates the compensation control signal 208 to the baseline wander compensation block 207 to compensate for BLW. The top peaks P_top and M_top have the same voltage level if there is no offset or baseline wander event.

Figure 4A:
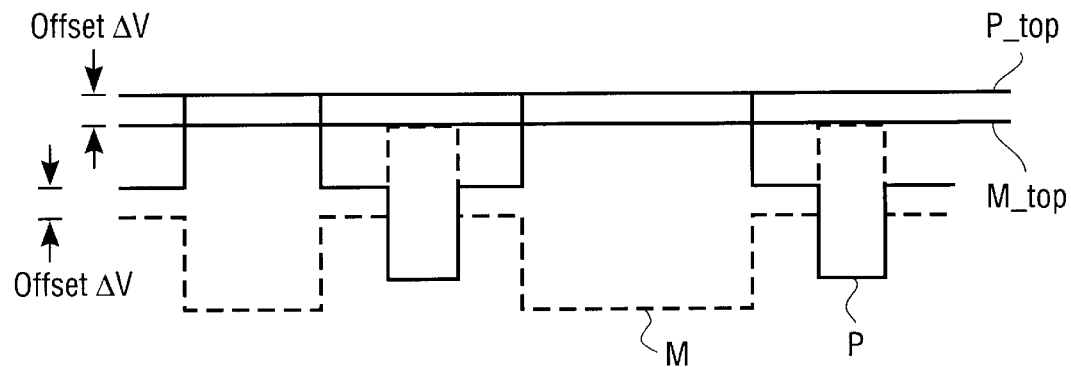
FIG. 4a is a waveform diagram of data signals and their peaks before Baseline Wander compensation.
Figure 4B:
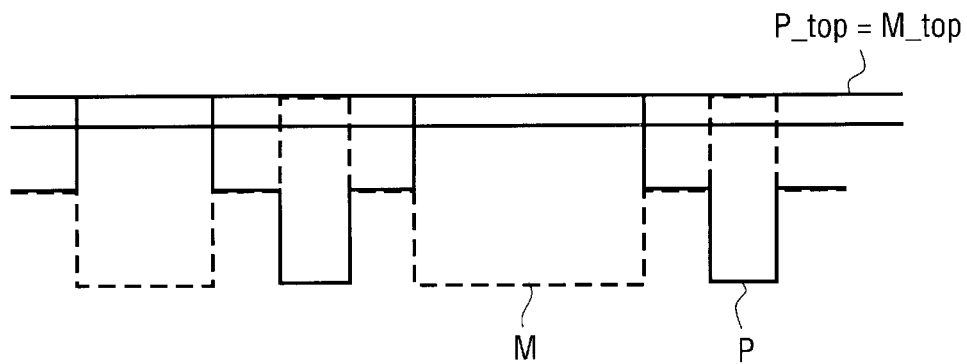
FIG. 4b is a waveform diagram of data signals and its peaks after Baseline Wander compensation.

As baseline wander occurs, the offset starts to build up in the input signals 209, in the forward path input signals 210 and consequently in the forward path output signals P and M. The peak detectors 204a and 204b then track the peaks of output signals P and M with this offset. The differential amplifier 206 sees this offset through the peak levels (P_top and M_top) and outputs the compensation control signals 208 to permit the baseline wander (BLW) compensation stage 207 to eliminate this offset by introducing a same amount of offset but in an opposite direction to the input signals 209. As a result, both output signals 210 of the baseline wander compensation (summing) stage 207 are balanced. Consequentially, the output signals P and M and its top peaks P_top and M_top are also balanced. The waveforms in FIG. 4a illustrate the peak detector levels P_top and M_top of the MLT-3 signals P and M before Baseline Wander compensation is provided to the signals P and M. FIG. 4b illustrates the peak detector levels P_top and M_top of the MLT-3 signals P and M after Baseline Wander compensation is provided to the signals P and M.

By using the peak detector approach to detect and compensate for baseline wander offset, the present invention eliminates the needs for a replica, stringent fixed amplitude and gain requirement of the data signals for the conventional approaches. Furthermore, the present invention can properly perform offset and baseline wander cancellation, even if the received signals are distorted due to overshoot and undershoot distortion. These distortions are either filtered out by the sampling window or averaged out by the peak detectors described above in present invention.

Another advantage achieved by the present invention is that it substantially reduces the circuit elements and complex algorithm implemented by generating the replica in the conventional approach, thereby reducing the operating current and die size. The peak detectors and window generators discussed above are very small and simple building block. In fact, the comparators, window generators and peak detectors in the present invention are existing circuit elements in the receiver block, which performs the equalized function and is described in the above-referenced U.S. Patent Application entitled "Adaptive Equalizer and Method" by Hai T. Nguyen and Menping Chang.

Additionally, the present invention provides a baseline wander compensation approach that is fully differential, thereby permitting a circuit in accordance with the present invention to have improved immunity to noise.

Figure 1A:
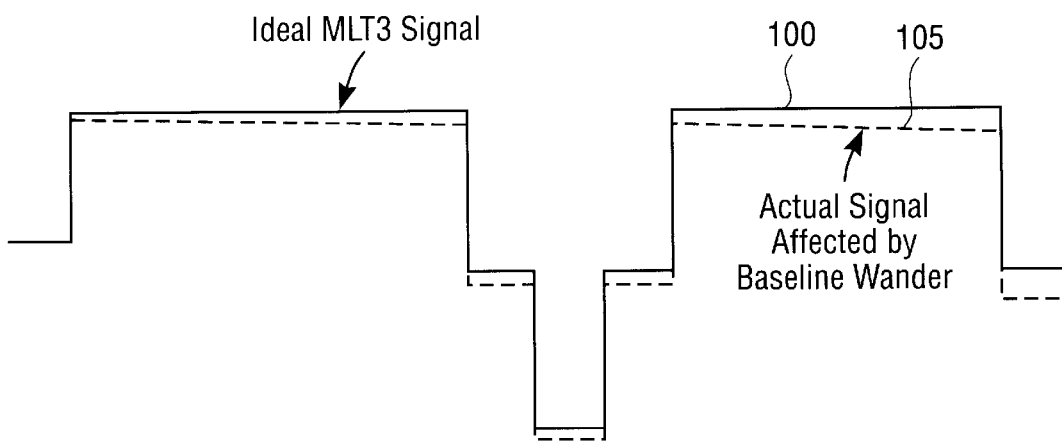
FIG. 1a is a waveform diagram comparing an ideal MLT-3 signal with an MLT-3 signal affected by baseline wander.
Figure 1B:
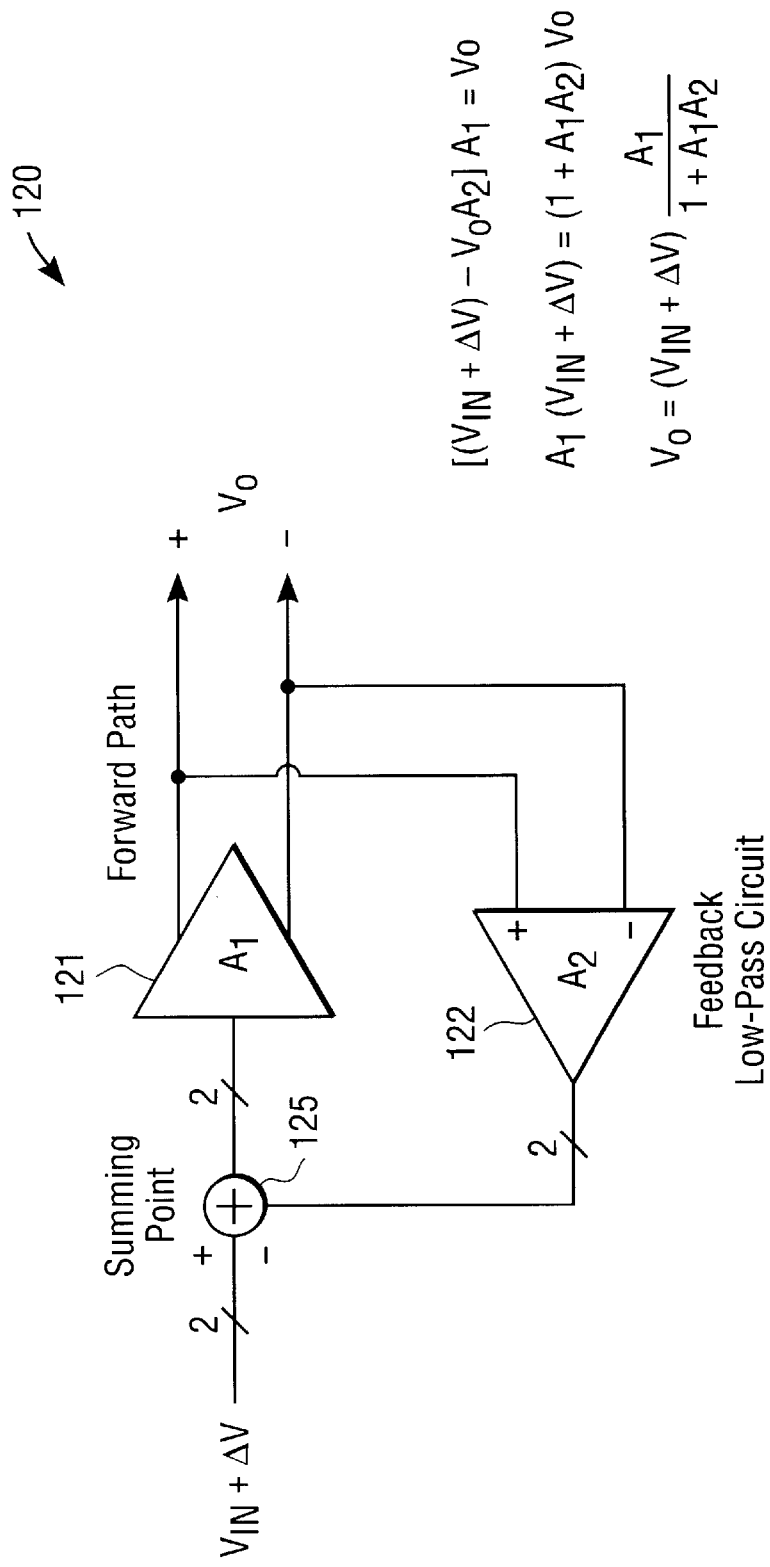
FIG. 1b is a schematic block diagram of a typical DC offset cancellation circuit.
Figure 1C:
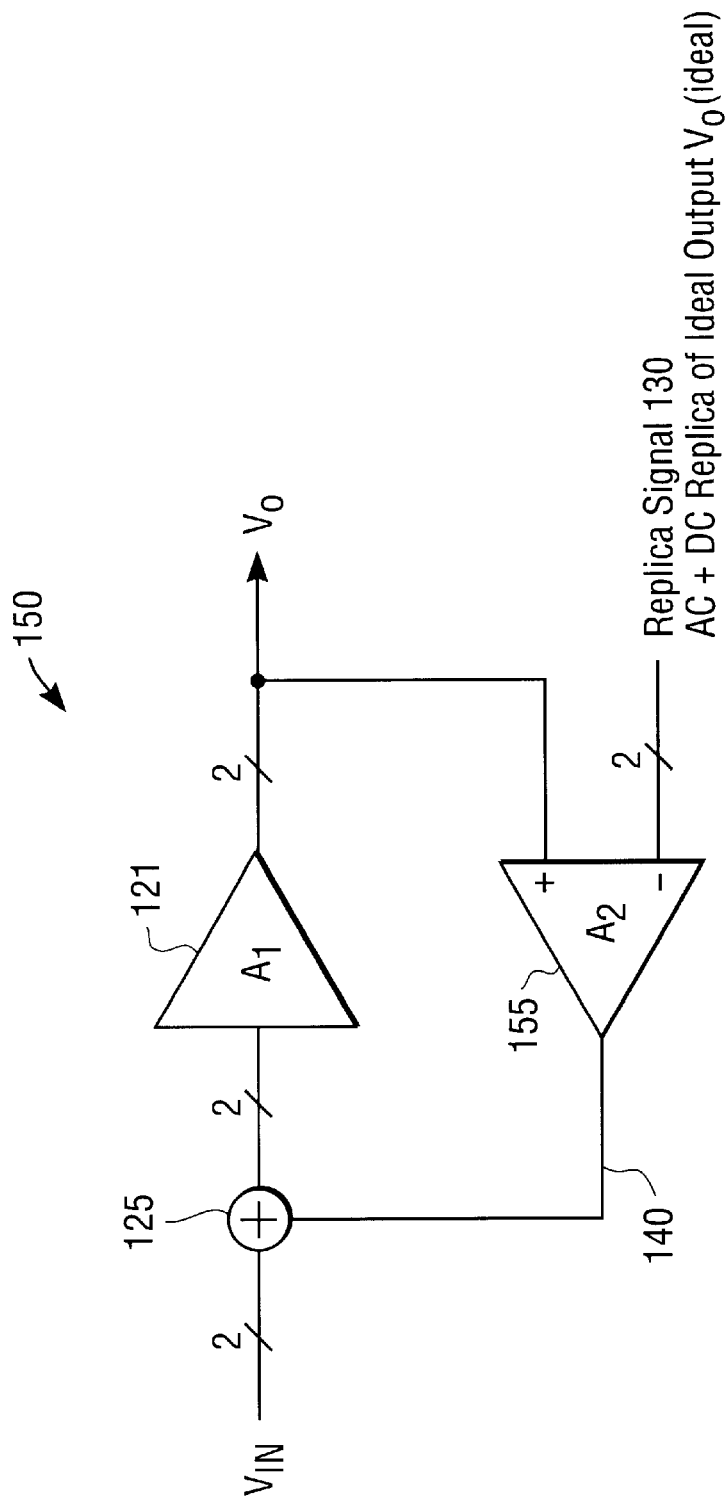
FIG. 1c is a schematic block diagram of the conventional offset cancellation circuit by using a replicated signal.
Figure 1D:
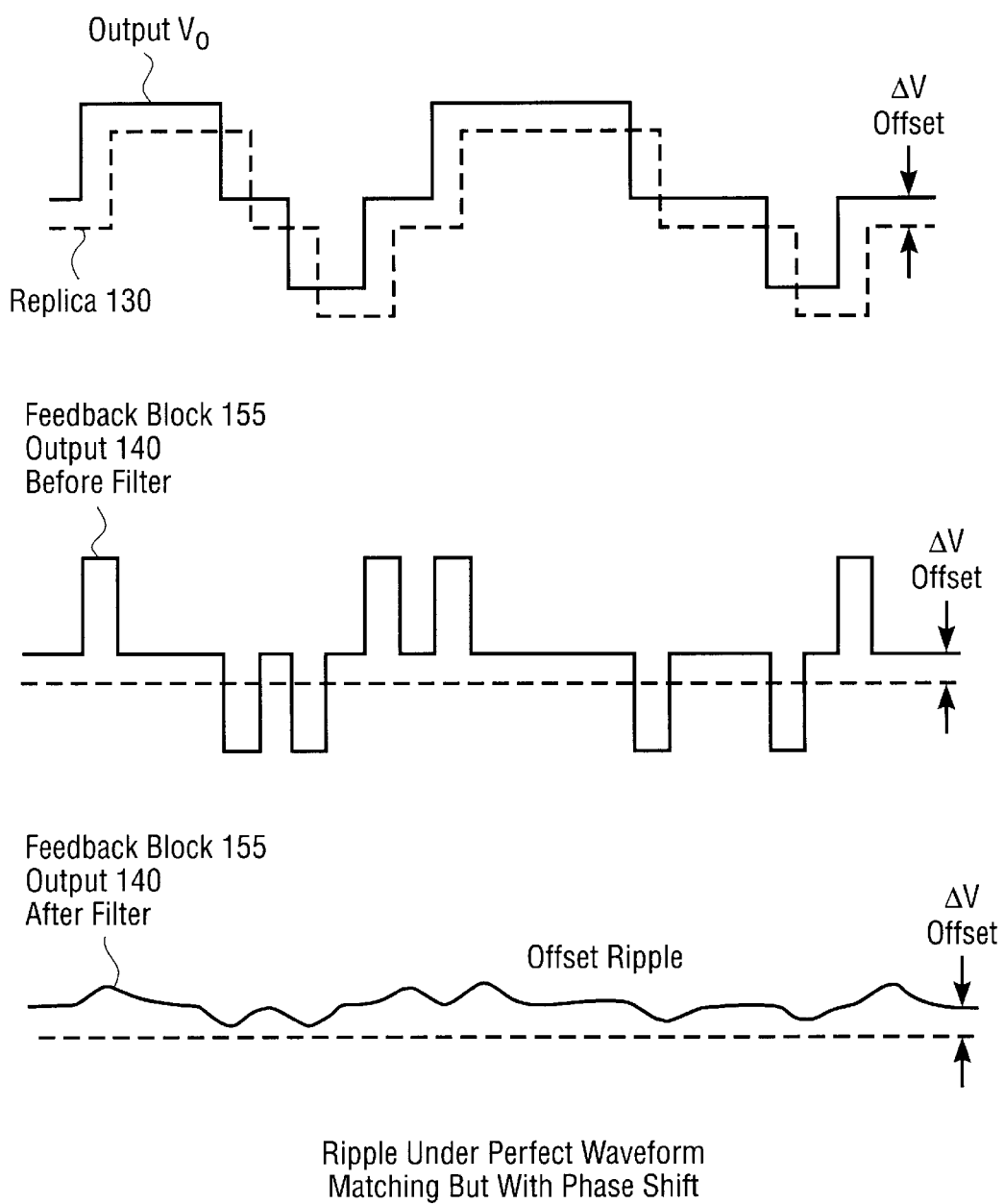
FIGS. 1d–1e are waveform diagrams in the conventional circuit of FIG. 1c; they illustrate the phase and gain mismatches causing a ripple effect.
Figure 1E:
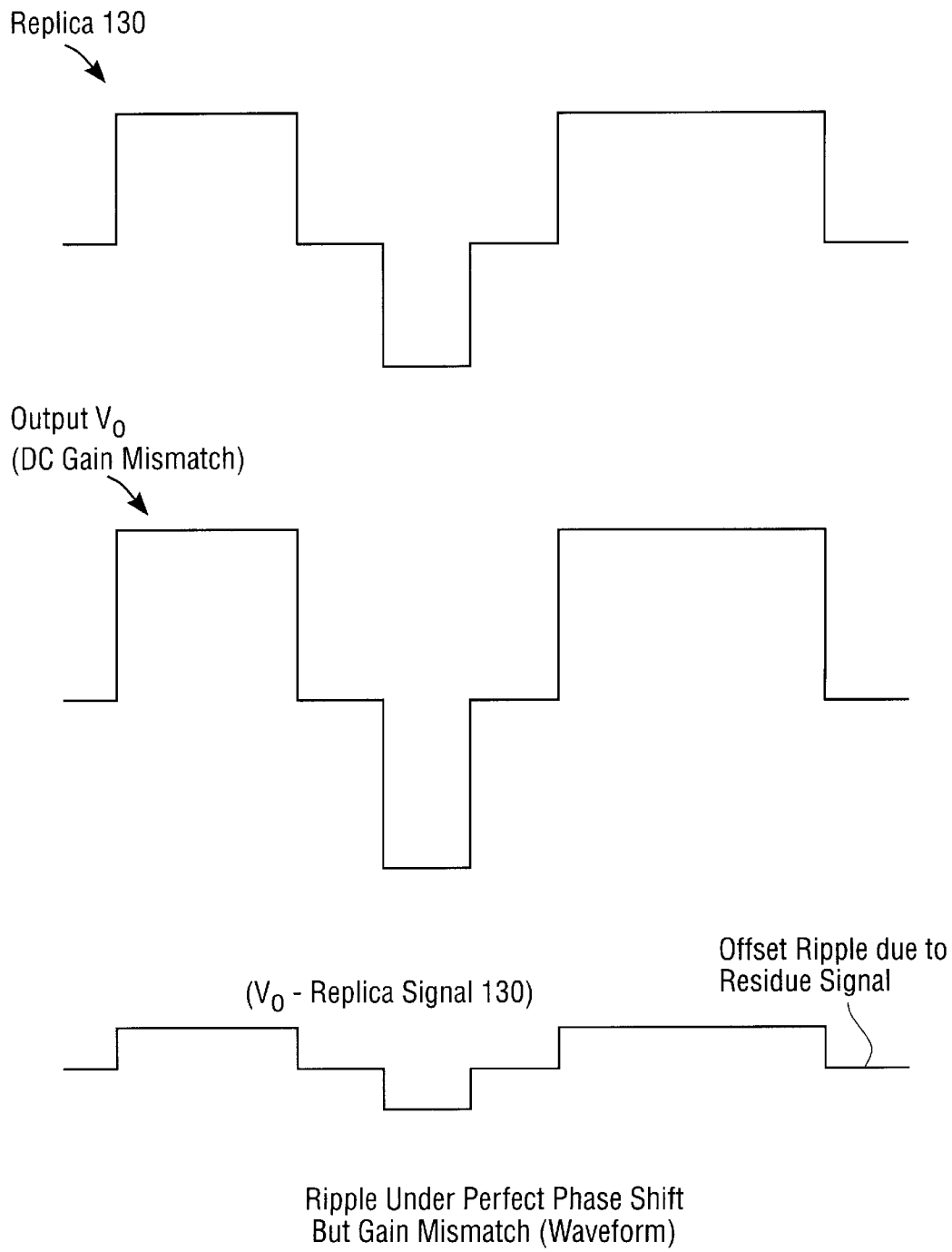

The present invention also does not have the problem of the conventional circuit 160 of FIG. 1d wherein a phase difference created between the data signal Vo and the replica signal 130. Thus, the present invention avoids the phase difference problem that can lead to improper baseline wander compensation and data recovery errors.

It is noted that other embodiments and configurations may be used to implement the circuits 220a and 220b for generating and controlling a smart window (FIG. 2b), depending on the application of the invention. The implementation of circuits 220a and 220b may be varied, for example, to select a specific portion and/or pattern of pulses that is more meaningful for the applications.

Although the present invention has been described in considerable detail with the comparison of the top peaks of the data signals, other versions are possible. For example, the present invention may be set to track either the bottom peaks of the data signals or any voltage level extracted from the signals using the sampling window.

Figure 5:
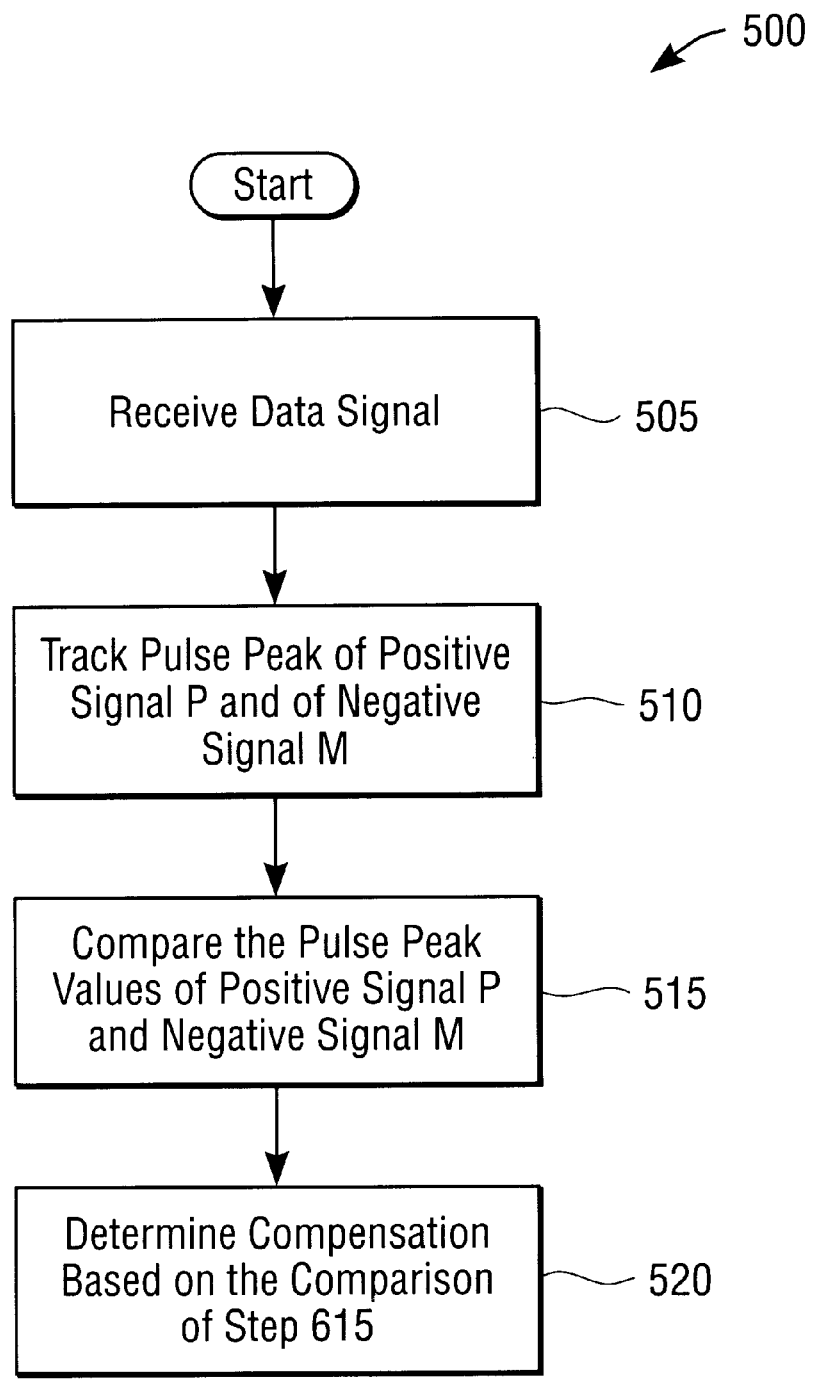
FIG. 5 is flowchart illustrating the operation of a baseline wander compensation circuit in accordance with an embodiment of the present invention.

FIG. 5 is a flowchart 500 describing an operation of a baseline wander compensation circuit in accordance with the present invention. A data signal is first received 505 by the baseline wander compensation circuit. The pulse peaks of a positive signal P of the data signal and the pulse peaks of a negative signal M are then tracked 510. A comparison 515 is then made for the pulse peak values of the positive signal P and the negative signal M. Based on the comparison 515, a proper amount of compensation can be determined 520 so that baseline wander or offset occurrence are eliminated from the data signal.

Figure 6:
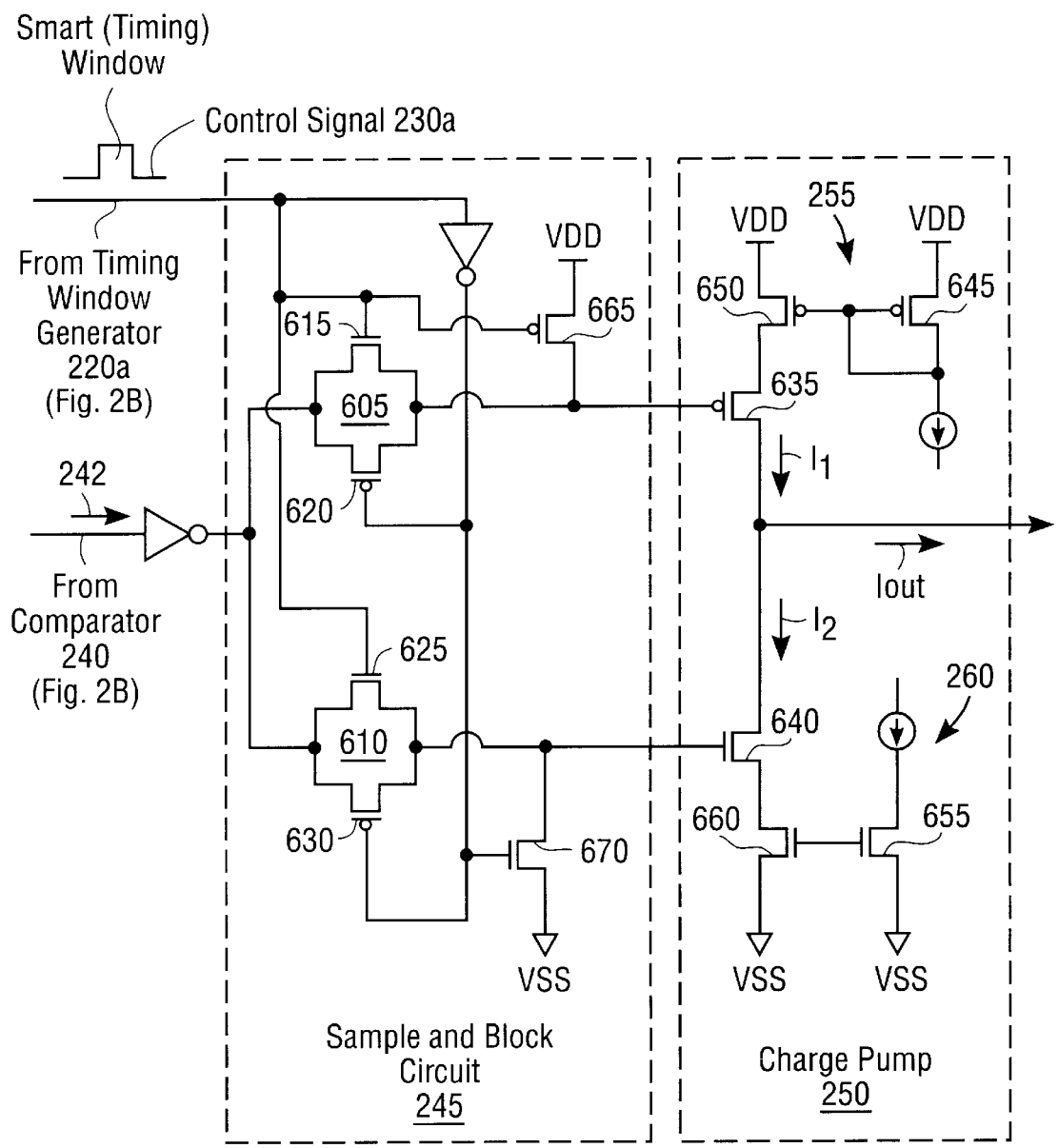
FIG. 6 is an embodiment of the sample and block circuit coupled to the charge pump.

FIG. 6 is a schematic block diagram of an embodiment of a sample and block circuit 245 that is integrated with charge pump 250. It is noted that other embodiments and configurations of the sample and block circuit 245 may be implemented depending on the application of the invention. In the embodiment shown in FIG. 6, the smart windows 335a–335c (FIG. 3) of signal 230a control a pair of transmission gates 605 and 610. The gate 605 includes n-channel transistor 615 and p-channel transistor 620, while the gate 610 includes n-channel transistor 625 and p-channel transistor 630. When the control signal 230a is high (i.e., a smart window is high or asserted), the comparing value signal 242 (from comparator 240 in FIG. 2b) is passed to pump control transistors 635 and 640. Thus, if the comparing value signal 242 is high, then the pump control transistor 635 is on and the pump control transistor 640 is off, thereby permitting the charge pump 250 to pump up. If the comparing value signal 242 is low, then the pump control transistor 635 is off and the pump control transistor 640 is on, thereby permitting the charge pump 250 to pump down. The pump-up current value $I_1$ is set by the fixed current source 255 including a current mirror formed by transistors 645 and 650. The pump-down current value $I_2$ is set by the fixed current source 260 including a current mirror formed by transistors 655 and 660.

When the control signal 230a is low (i.e., a smart window is not present), both transmission gates 605 and 610 are off. The p-channel transistor 665 is on and will pull the gate of pump control transistor 635 high, thereby turning off transistor 635. The n-channel transistor 670 is on and pulls the gate of pump control transistor 640 low, thereby turning off the transistor 640. Since the pump control transistors 635 and 640 are off, the value of $I_{out}$ is zero and the value of P_top remains the same.

What is claimed is:

1. An apparatus for compensating for offset and Baseline Wander Effect in an input signal, comprising:

a forward path stage configured to receive a forward path input signal and to generate a first forward path output signal (P) and a second forward path output signal (M);

coupled to the forward path stage, a first peak detector configured to receive the first forward path output signal (P) from the forward path stage and capable of detecting a peak of the first forward path output signal (P), the first peak detector further capable of generating a peak signal (P_top) which is a value of the peak of the first forward path output signal (P);

coupled to the forward path stage, a second peak detector configured to receive the second forward path output signal (M) from the forward path stage and capable of detecting a peak of the second forward path output signal (M), the second peak detector further capable of generating a peak signal (M_top) which is a value of the peak of the second forward path signal (M);

a first window generator coupled to the first peak detector and configured to generate a top peak timing window in response to a pulse occurrence in the first forward path output signal (P);

a second window generator coupled to the second peak detector and configured to generate a bottom peak timing window in response to a pulse occurrence in the second forward path output signal (M);

wherein the top peak timing window enables the first peak detector to process the first forward path output signal (P) to generate the peak signal (P_top);

wherein the bottom peak timing window enables the second peak detector to process the second forward path output signal (M) to generate the peak signal (M_top);

a differential amplifier coupled to the first peak detector and the second peak detector and capable of generating an offset control signal based upon a difference between the peak signal (P_top) and the peak signal (M_top); and a compensation stage coupled to the differential amplifier and capable of compensating for offset in the input signal in response to the offset control signal, the compensation stage further configured to generate the forward path input signal for input into the forward path stage.

2. The apparatus of claim 1 wherein at least one of the peak detectors comprises:

a comparator having a first input for receiving one of the first forward path output signal (P) and the second forward path output signal (M), a second input for receiving a peak level signal of one of the first forward path output signal (P), and the second forward path output signal (M), and an output;

a sample and block circuit coupled to the output of the comparator and capable of sampling a portion of one of the first forward path output signal (P) and the second forward path output signal (M), the portion of one of the first forward path output signal (P) and the second forward path output signal (M) being defined by the timing window received by the sample and block circuit;

a charge pump coupled to the sample and block circuit and capable of setting a value of the peak level signal based upon a control signal generated by the sample and block circuit; and a timing window generator coupled to the sample and block circuit and capable of generating the timing window.

3. The peak detector of claim 2 wherein the sample and block circuit comprises:

a first transmission gate capable of receiving the timing window;

a second transmission gate coupled to the first transmission gate and capable of receiving the timing window;

a first transistor coupled to the first transmission gate and capable generating a first output control signal having a value dependent on values of the input signal and the timing window; and a second transistor coupled to the second transmission gate and capable of generating a second output control signal having a value dependent on values of the input signal and the timing window.

4. The peak detector of claim 2 wherein the timing window generator comprises:

a delay stage for receiving one of the first forward path output signal (P) and the second forward path output signal (M);

an inverter coupled to the delay stage and capable of generating an inverted signal; and an AND gate coupled to the inverter and capable of receiving one of the first forward path output signal (P) and the second forward path output signal (M), and the inverted signal to generate a timing window.

5. A method of compensating for offset in an input signal, the method comprising:

receiving the input signal by use of a forward path stage, the input signal comprising a first signal (P) and a second signal (M);

detecting a level of the first signal (P);

detecting a level of the second signal (M);

generating a top peak timing window in response to a pulse occurrence in the first signal (P), wherein the top peak timing window enables processing of the first signal (P) to generate a peak signal (P_top) representing a level of the first signal (P);

generating a bottom peak timing window in response to a pulse occurrence in the second signal (M), wherein the bottom peak timing window enables processing of the second forward path output signal (M) to generate a peak signal (M_top) representing a level of the second signal (M); and generating an offset control signal to reduce an offset in the input signal in response to a difference between the peak signal (P_top) and the peak signal (M_top).

6. An apparatus for compensating for offset occurrence in an input signal, comprising:

a summing stage configured to receive the input signal comprising a first signal (P) and a second signal (M);

coupled to the summing stage, a forward path stage configured to transmit the first signal (P) and the second signal (M);

coupled to the forward path stage, a first peak detector configured to detect a peak level of the first signal (P);

coupled to the forward path stage, a second peak detector configured to detect a peak level of the second signal (M);

a first window generator coupled to the first peak detector and configured to generate a top peak timing window in response to a pulse occurrence in the first signal (P);

a second window generator coupled to the second peak detector and configured to generate a bottom peak timing window in response to a pulse occurrence in the second signal (M);

wherein the top peak timing window enables the first peak detector to process the first signal (P) to determine the peak level of the first signal (P);

wherein the bottom peak timing window enables the second peak detector to process the second signal (M) to determine the peak level of the second signal (M); and a differential amplifier for comparing the peak levels of the first signal (P) and the second signal (M) and for generating a compensation control signal based on the comparison of the peak levels, the compensation control signal permitting the summing stage to perform compensation on the input signal.

7. An apparatus for compensating for offset occurrence in an input signal, comprising:

a summing stage configured to receive the input signal including a first signal (P) and a second signal (M);

coupled to the summing stage, a forward path stage configured to transmit the first signal (P) and the second signal (M);

coupled to the forward path stage, first means for detecting a level of the first signal (P) from the forward path stage;

coupled to the forward path stage, second means for detecting a level of the second signal (M) from the forward path stage;

a first window generator coupled to the first means and configured to generate a top peak timing window in response to a pulse occurrence in the first signal (P);

a second window generator coupled to the second means and configured to generate a bottom peak timing window in response to a pulse occurrence in the second signal (M);

wherein the top peak timing window enables the first means to process the first signal (P) to generate the peak signal (P_top);

wherein the bottom peak timing window enables the second means to process the second forward path output signal (M) to generate the peak signal (M_top); and coupled the first means and second means, means for generating an offset control signal to reduce an offset in the input signal in response to the level difference of the first signal (P) and the second signal (M), the summing stage providing compensation to the input signal in response to the control signal.

8. An apparatus for compensating for offset and Baseline Wander Effect in an input signal, comprising:

a forward path stage configured to receive a forward path input signal and to generate a first forward path output signal (P) and a second forward path output signal (M);

coupled to the forward path stage, a first peak detector configured to receive the first forward path output signal (P) from the forward path stage and capable of detecting a peak of the first forward path output signal (P), the first peak detector further capable of generating a peak signal (P_top) which is a value of the peak of the first forward path output signal (P);

coupled to the forward path stage, a second peak detector configured to receive the second forward path output signal (M) from the forward path stage and capable of detecting a peak of the second forward path output signal (M), the second peak detector further capable of generating a peak signal (M_top) which is a value of the peak of the second forward path signal (M);

a differential amplifier coupled to the first peak detector and the second peak detector and capable of generating an offset control signal based upon a difference between the peak signal (P_top) and the peak signal (M_top);

a compensation stage coupled to the differential amplifier and capable of compensating for offset in the input signal in response to the offset control signal, the compensation stage further configured to generate the forward path input signal for input into the forward path stage;

wherein at least one of the peak detectors comprises:

a comparator having a first input for receiving one of the first forward path output signal (P) and the second forward path output signal (M), a second input for receiving a peak level signal of one of the first forward path output signal (P), and the second forward path output signal (M), and an output;

a sample and block circuit coupled to the output of the comparator and capable of sampling a portion of one of the first forward path output signal (P), and the second forward path output signal (M), the portion of one of the first forward path output signal (P), and the second forward path output signal (M) being defined by a timing window received by the sample and block circuit;

a charge pump coupled to the sample and block circuit and capable of setting a value of the peak level signal based upon a control signal generated by the sample and block circuit; and a timing window generator coupled to the sample and block circuit and capable of generating the timing window;

wherein the sample and block circuit comprises:

a first transmission gate capable of receiving the timing window;

a second transmission gate coupled to the first transmission gate and capable of receiving the timing window;

a first transistor coupled to the first transmission gate and capable generating a first output control signal having a value dependent on values of the input signal and the timing window; and a second transistor coupled to the second transmission gate and capable of generating a second output control signal having a value dependent on values of the input signal and the timing window.

9. An apparatus for compensating for offset and Baseline Wander Effect in an input signal, comprising:

a forward path stage configured to receive a forward path input signal and to generate a first forward path output signal (P) and a second forward path output signal (M);

coupled to the forward path stage, a first peak detector configured to receive the first forward path output signal (P) from the forward path stage and capable of detecting a peak of the first forward path output signal (P), the first peak detector further capable of generating a peak signal (P_top) which is a value of the peak of the first forward path output signal (P);

coupled to the forward path stage, a second peak detector configured to receive the second forward path output signal (M) from the forward path stage and capable of detecting a peak of the second forward path output signal (M), the second peak detector further capable of generating a peak signal (M_top) which is a value of the peak of the second forward path signal (M);

a differential amplifier coupled to the first peak detector and the second peak detector and capable of generating an offset control signal based upon a difference between the peak signal (P_top) and the peak signal (M_top);

a compensation stage coupled to the differential amplifier and capable of compensating for offset in the input signal in response to the offset control signal, the compensation stage further configured to generate the forward path input signal for input into the forward path stage;

wherein at least one of the peak detectors comprises:

a comparator having a first input for receiving one of the first forward path output signal (P) and the second forward path output signal (M), a second input for receiving a peak level signal of one of the first forward path output signal (P) and the second forward path output signal (M), and an output;

a sample and block circuit coupled to the output of the comparator and capable of sampling a portion of one of the first forward path output signal (P) and the second forward path output signal (M), the portion of one of the first forward path output signal (P) and the second forward path output signal (M) being defined by a timing window received by the sample and block circuit;

a charge pump coupled to the sample and block circuit and capable of setting a value of the peak level signal based upon a control signal generated by the sample and block circuit;

a timing window generator coupled to the sample and block circuit and capable of generating the timing window;

wherein the timing window generator comprises:

a delay stage for receiving one of the first forward path output signal (P) and the second forward path output signal (M);

an inverter coupled to the delay stage and capable of generating an inverted signal; and an AND gate coupled to the inverter and capable of receiving one of the first forward path output signal (P) and the second forward path output signal (M), and the inverted signal to generate a timing window.

10. An apparatus for compensating for offset occurrence in an input signal, comprising:

a summing stage configured to receive the input signal comprising a first signal (P) and a second signal (M);

coupled to the summing stage, a forward path stage configured to transmit the first signal (P) and the second signal (M);

coupled to the forward path stage, a first peak detector configured to detect a peak level of the first signal (P);

coupled to the forward path stage, a second peak detector configured to detect a peak level of the second signal (M);

a first window generator coupled to the first peak detector and configured to generate a top peak timing window in response to a pulse occurrence in the first signal (P);

a second window generator coupled to the second peak detector and configured to generate a bottom peak timing window in response to a pulse occurrence in the second signal (M);

wherein the top peak timing window enables the first peak detector to process the first signal (P) to determine the peak level of the first signal (P), the top peak timing window permitting the selective sampling of pulses of the first signal (P) to determine the peak level of the first signal (P);

wherein the bottom peak timing window enables the second peak detector to process the second signal (M) to determine the peak level of the second signal (M), the bottom peak timing window permitting the selective sampling of pulses of the second signal (M) to determine the peak level of the second signal (M); and a differential amplifier for comparing the peak levels of the first signal (P) and the second signal (M) and for generating a compensation control signal based on the comparison of the peak levels, the compensation control signal permitting the summing stage to perform compensation on the input signal.

* * * * *